US010530252B2

(12) United States Patent
Imamura et al.

(10) Patent No.: US 10,530,252 B2
(45) Date of Patent: Jan. 7, 2020

(54) PULSE-FREQUENCY CONTROL CIRCUIT, MICROCOMPUTER, DC-TO-DC CONVERTER, AND PULSE-FREQUENCY CONTROL METHOD

(71) Applicant: PANASONIC INTELLECTUAL PROPERTY MANAGEMENT CO., LTD., Osaka (JP)

(72) Inventors: Katsuyuki Imamura, Osaka (JP); Takeaki Moto, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/421,080

(22) Filed: May 23, 2019

(65) Prior Publication Data
US 2019/0280598 A1    Sep. 12, 2019

Related U.S. Application Data

(63) Continuation of application No. PCT/JP2017/040869, filed on Nov. 14, 2017.

(30) Foreign Application Priority Data

Nov. 28, 2016  (JP) .................... 2016-230490

(51) Int. Cl.
*H02M 3/157* (2006.01)
*H02M 1/08* (2006.01)
(Continued)

(52) U.S. Cl.
CPC ............ *H02M 3/157* (2013.01); *H02M 1/08* (2013.01); *H02M 3/335* (2013.01); *H02M 3/156* (2013.01)

(58) Field of Classification Search
CPC ........ H02M 3/335; H02M 1/08; H02M 1/143; H02M 2001/0058; H02M 3/156;
(Continued)

(56) References Cited

U.S. PATENT DOCUMENTS 5,517,155 A * 5/1996 Yamauchi ............. H03L 7/08
327/107
2006/0255866 A1* 11/2006 Hirai ................. H03K 5/15013
331/45
(Continued)

FOREIGN PATENT DOCUMENTS

JP    2013-236295 A    11/2013

OTHER PUBLICATIONS

International Search Report and Written Opinion dated Feb. 6, 2018, in International Patent Application No. PCT/JP2017/040869; with partial English translation.

Primary Examiner — Alex Torres-Rivera
(74) Attorney, Agent, or Firm — McDermott Will & Emery LLP

(57) ABSTRACT

A pulse-frequency control circuit includes: a selection circuit that receives, and selects from among, a plurality of reference clocks whose phases differ from one another and which have a same reference period; a setting register that stores information for identifying a setting period that is in increments of a first duration shorter than the reference period; and a control circuit that causes, based on the information stored in the setting register, the selection circuit to sequentially and repeatedly select, as a determined rising edge, a rising edge occurring at intervals of the setting period from among rising edges of the plurality of reference clocks, in which the selection circuit sequentially and repeatedly generates an output pulse whose rising edge
(Continued)

coincides with the determined rising edge selected, to provide an output pulse sequence of the output pulses.

10 Claims, 10 Drawing Sheets

(51) Int. Cl.
*H02M 3/335* (2006.01)
*H02M 3/156* (2006.01)

(58) Field of Classification Search
CPC ......... H02M 3/157; H03K 3/017; H03K 3/02; H03K 5/05; H03K 7/08; H03K 23/64; H03K 7/06; H03K 17/9532; H03K 17/9545
See application file for complete search history.

(56) References Cited

U.S. PATENT DOCUMENTS

| | | | |
|---|---|---|---|
| 2010/0039157 A1* | 2/2010 | Kaeriyama | ............... G06F 1/08 327/292 |
| 2011/0199164 A1* | 8/2011 | Lukic | ...................... H03K 7/06 332/109 |
| 2012/0274146 A1* | 11/2012 | Laur | ................ H02M 3/33561 307/82 |
| 2016/0079984 A1* | 3/2016 | Cochet | .................. H03K 21/38 327/115 |

\* cited by examiner

PULSE-FREQUENCY CONTROL CIRCUIT, MICROCOMPUTER, DC-TO-DC CONVERTER, AND PULSE-FREQUENCY CONTROL METHOD

CROSS REFERENCE TO RELATED APPLICATIONS

This application is a U.S. continuation application of PCT International Patent Application Number PCT/JP2017/040869 filed on Nov. 14, 2017, claiming the benefit of priority of Japanese Patent Application Number 2016-230490 filed on Nov. 28, 2016, the entire contents of which are hereby incorporated by reference.

BACKGROUND

1. Technical Field

The present disclosure relates to a pulse-frequency control circuit for controlling a frequency of an output pulse, a microcomputer including the pulse-frequency control circuit, a DC-to-DC converter including the pulse-frequency control circuit, and a pulse-frequency control method for controlling a frequency of an output pulse.

2. Description of the Related Art

Conventionally, a DC-to-DC converter including a switching element that is repeatedly switchable between a conductive state and a non-conductive state has been known.

In general, an output voltage of such a DC-to-DC converter is controlled by controlling a control signal that is provided to the switching element and formed as a pulse sequence for repeatedly switching between the conductive state and the non-conductive state (see Japanese Unexamined Patent Application Publication No. 2013-236295, for example).

Such a control of the control signal formed as the pulse sequence includes: pulse-width control which controls the duty cycle of the pulse sequence; and pulse-frequency control which controls the frequency of the pulse sequence.

As a control circuit for performing the pulse-frequency control, a pulse-frequency control circuit which, when receiving a reference clock signal, can provide a pulse sequence having a period that is set to an integral multiple of the clock period of the reference clock signal has been conventionally known.

SUMMARY

Unfortunately, the forgoing conventional pulse-frequency circuit cannot provide a pulse sequence having a period that is in increments of a duration shorter than the clock period of a reference clock signal.

The present disclosure is conceived in view of the foregoing problems, and has an object to provide a pulse-frequency control circuit, a microcomputer, a DC-to-DC converter, and a pulse-frequency control method which can provide a pulse sequence having a period that is in increments of a duration shorter than the clock period of a reference clock signal.

A pulse-frequency control circuit according to one aspect of the present disclosure includes: a selection circuit that receives, and selects from among, a plurality of reference clocks whose phases differ from one another and which have a same reference period; a setting register that stores information for identifying a setting period that is in increments of a first duration shorter than the reference period; and a control circuit that causes, based on the information stored in the setting register, the selection circuit to sequentially and repeatedly select, as a determined rising edge, a rising edge occurring at intervals of the setting period from among rising edges of the plurality of reference clocks, in which the selection circuit sequentially and repeatedly generates an output pulse whose rising edge coincides with the determined rising edge selected, to provide an output pulse sequence of the output pulses.

A microcomputer according to one aspect of the present disclosure includes: the above pulse-frequency control circuit; and a setter that writes a value to the setting register.

A DC-to-DC converter according to one aspect of the present disclosure includes: the above microcomputer; a switching element that performs switching of an input voltage in accordance with the output pulse sequence provided from the selection circuit, the input voltage being a direct current input voltage; an energy conversion circuit that, when receiving the input voltage the switching of which has been performed by the switching element, generates an electromotive force due to current fluctuation caused by voltage fluctuation of the input voltage and provides a voltage depending on the electromotive force; and a rectifying and smoothing circuit that rectifies and smoothes the voltage provided from the energy conversion circuit and provides an output voltage, the output voltage being a direct current output voltage, in which the microcomputer further includes a comparator that compares a potential of the output voltage with a predetermined potential, and the setter performs the writing based on a comparison result by the comparator so that the potential of the output voltage is closer to the predetermined potential.

A pulse-frequency control method according to one aspect of the present disclosure is a pulse-frequency control method performed by a pulse-frequency control circuit including a selection circuit, a setting register, and a control circuit, the selection circuit receiving, and selecting from among, a plurality of reference clocks whose phases differ from one another and which have a same reference period. The pulse-frequency control method includes: storing, by the setting register, information for identifying a setting period that is in increments of a first duration shorter than the reference period; causing, by the control circuit, based on the information stored by the storing, the selection circuit to sequentially and repeatedly select, as a determined rising edge, a rising edge occurring at intervals of the setting period from among rising edges of the plurality of reference clocks; and sequentially and repeatedly generating, by the selection circuit, an output pulse whose rising edge coincides with the determined rising edge selected, to provide an output pulse sequence of the output pulses.

With the foregoing pulse-frequency control circuit, microcomputer, DC-to-DC converter, and pulse-frequency control method, it is possible to provide the pulse sequence having the period that is in increments of the duration shorter than the clock period of the reference clock signal.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Hereinafter, a specific example of a pulse-frequency control circuit, a microcomputer, a DC-to-DC converter, and a pulse-frequency control method according to one aspect of the present disclosure will be described with reference to the drawings. It should be noted that the subsequently-described embodiment shows a generic or specific example of the present disclosure. Therefore, numerical values, shapes, materials, structural components, the arrangement and connection of the structural components, processes, the order of processes, etc. shown in the following embodiment are mere examples, and are not intended to limit the scope of the present disclosure. Furthermore, among the structural components in the following embodiment, components not recited in the independent claim which indicates the broadest concept of the present disclosure are described as arbitrary structural components.

In addition, each of the drawings is a schematic diagram and thus is not necessarily strictly illustrated. In each of the drawings, substantially the same structural components are assigned with the same reference signs, and redundant descriptions will be omitted or simplified.

Embodiment

[1. Configuration]

Figure 1:
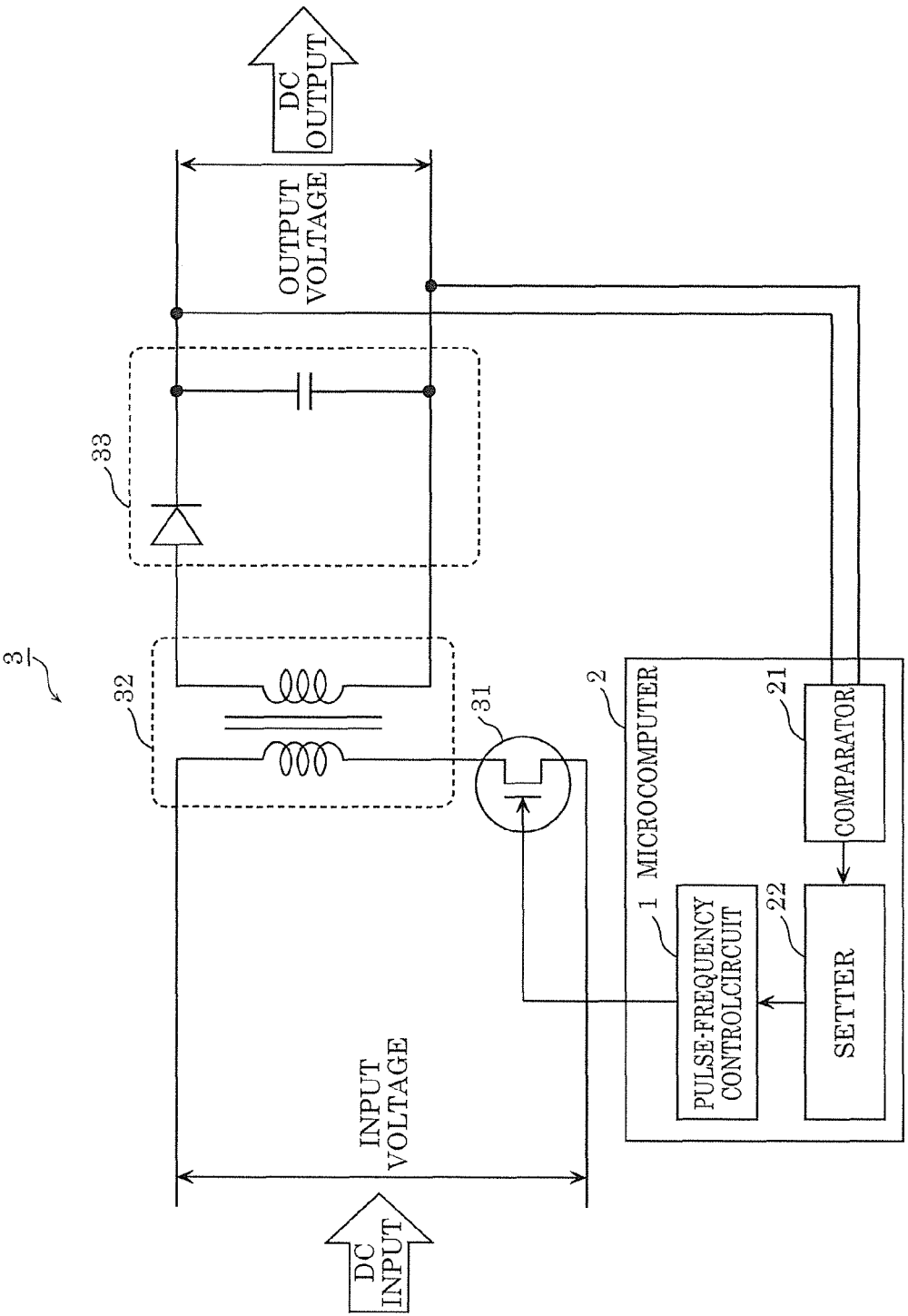
FIG. 1 illustrates a block diagram of the configuration of a DC-to-DC converter according to an embodiment.

FIG. 1 illustrates a block diagram of the configuration of DC-to-DC converter 3 according to an embodiment.

As shown in FIG. 1, DC-to-DC converter 3 includes switching element 31, energy conversion circuit 32, rectifying and smoothing circuit 33, and microcomputer 2.

Switching element 31 is implemented by, for example, a gallium nitride field effective transistor (FET). Switching element 31 performs switching of a direct current input voltage in accordance with a control signal (an output pulse sequence described below) provided from microcomputer 2. The switching now refers to repeatedly switching between a conductive state and a non-conductive state.

Energy conversion circuit 32 is implemented by, for example, a transformer. When receiving the input voltage on which the switching is performed by switching element 31, energy conversion circuit 32 generates an electromotive force due to current fluctuation caused by voltage fluctuation of the input voltage, and provides a voltage depending on the generated electromotive force.

Rectifying and smoothing circuit 33 is implemented by, for example, one or more diodes and one or more capacitors. Rectifying and smoothing circuit 33 rectifies and smoothes the voltage provided from energy conversion circuit 32, and provides a direct current output voltage.

Microcomputer 2 includes comparator 21, setter 22, and pulse-frequency control circuit 1.

Comparator 21 is implemented by, for example, a comparator. Comparator 21 compares the potential of the output voltage with the predetermined potential.

Setter 22 is implemented by, for example, causing a processor (not shown) included in microcomputer 2 to execute a program stored on a memory (not shown) included in microcomputer 2. Setter 22 writes a value to a setting register (described below) included in pulse-frequency control circuit 1. More specifically, based on a comparison result by comparator 21, this writing is performed so that the potential of the output voltage is closer to the predetermined potential.

Figure 2:
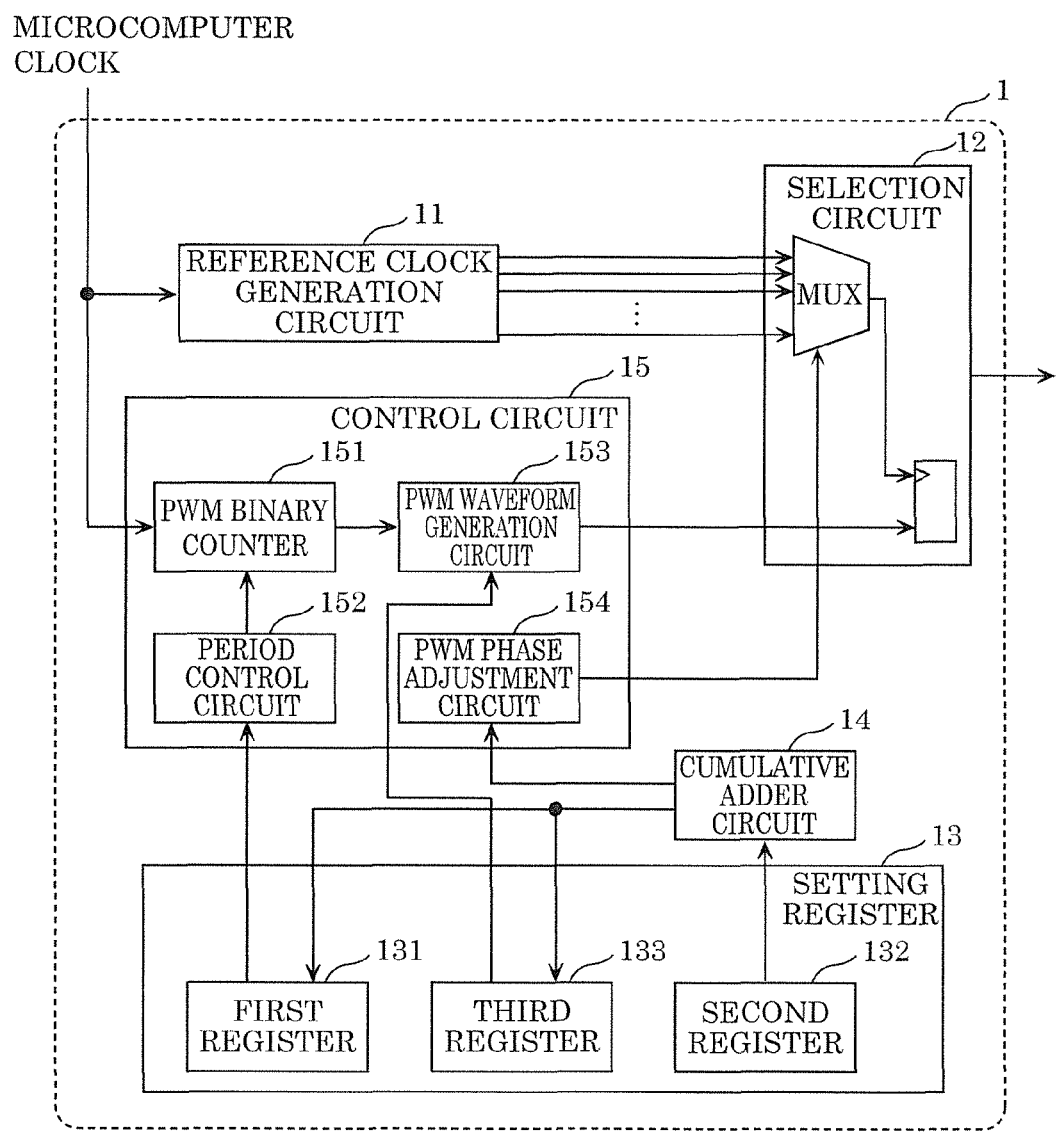
FIG. 2 illustrates a block diagram of the configuration of a pulse-frequency control circuit according to the embodiment.

FIG. 2 illustrates a block diagram of the configuration of pulse-frequency control circuit 1.

As shown in FIG. 2, pulse-frequency control circuit 1 includes reference clock generation circuit 11, selection circuit 12, setting register 13, cumulative adder circuit 14, and control circuit 15.

Reference clock generation circuit 11 generates two or more reference clocks, which are received by selection circuit 12 described below, from a microcomputer clock (an input reference clock) used by microcomputer 2 as a clock signal. More specifically, reference clock generation circuit 11 generates N reference clocks whose phases differ by 1/N, where N is an integer greater than or equal to 2, from one another and which have the same period (a reference period) as the input reference clock.

Reference clock generation circuit 11 is implemented by, for example, a delay locked loop (DLL) circuit.

Selection circuit 12 receives, and selects from among, the reference clocks whose phases differ from one another and which have the same reference period. More specifically, selection circuit 12 receives, and selects from among, N reference clocks generated by reference clock generation circuit 11.

Furthermore, selection circuit 12 is controlled by control circuit 15 (described below) to repeatedly select a determined rising edge (described below) from among the rising edges of the reference clocks, and sequentially and repeatedly generates an output pulse whose rising edge coincides with the selected determined rising edge to provide an output pulse sequence of the generated output pulses.

Selection circuit 12 is also controlled by control circuit 15 to select a determined falling edge (described below) corresponding to the selected determined rising edge, and generates the output pulse whose rising edge coincides with the selected determined rising edge and whose falling edge coincides with the selected determined falling edge.

Setting register 13 stores information for identifying a setting period that is in increments of a duration (the first duration) shorter than the reference period. More specifically, setting register 13 comprises: period setting register (first register) 131 which stores the first information for identifying integer part M, where M is an integer greater than or equal to 1, of a quotient obtained by dividing the setting period by the reference period; high-resolution period setting register (second register) 132 which stores the second information for identifying fractional part L of the quotient, where L is a decimal fraction greater than or equal to 0 and less than 1; and pulse width setting register (third register) 133 which stores the third information for identifying integer P, where P is an integer greater than or equal to 1 and less than M.

These registers can be set by setter 22 as needed.

Based on the second information stored in high-resolution period setting register (second resister) 132, cumulative adder circuit 14 cumulatively adds L/2 every time the rising edge or the falling edge occurs in the output pulse sequence provided from selection circuit 12. When L/2 is added J times, where J is an integer greater than or equal to 0, cumulative adder circuit 14 calculates cumulative sum LL(J).

Furthermore, when LL(J) obtained by cumulatively adding L/2 is greater than or equal to 1, cumulative adder circuit 14 (i) calculates new LL(J) by subtracting 1 from the obtained LL(J), (ii) updates the information stored in period setting register (first register) 131 from the information for identifying M to the information for identifying M+1, and (iii) further updates the information stored in period setting register (first register) 131 from the information for identifying M+1 to the information for identifying M at a time when the rising edge occurs after the update (ii) in the output pulse sequence provided from selection circuit 12. Furthermore, when LL(J) obtained by cumulatively adding L/2 is greater than or equal to 1, cumulative adder circuit 14 (iv) updates the information stored in pulse width setting register (third resister) 133 from the information for identifying P to the information for identifying P+1, and (v) further updates the information stored in pulse width setting register (third register) 133 from the information for identifying P+1 to the information for identifying P at a time when the rising edge occurs after the update (iv) in the output pulse sequence provided from selection circuit 12.

Based on the information stored in setting register 13, control circuit 15 causes selection circuit 12 to sequentially and repeatedly select, as the determined rising edge, a rising edge occurring at intervals of the setting period from among the rising edges of the reference clocks. More specifically, control circuit 15 (i) based on the first information stored in period setting register (first resister) 131, sequentially and repeatedly generates a normal pulse having a period that is M times the reference period, and thereby generates a normal pulse sequence of the normal pulses, and (ii) based on the second information stored in high-resolution period setting register (second resister) 132, causes selection circuit 12 to sequentially and repeatedly select the determined rising edge so that in K-th selection, where K is an integer greater than or equal to 0, a rising edge of one of the reference clocks which is delayed relative to the first rising edge of the normal pulse sequence by a duration that is LL(2×K) times the reference period is selected as the determined rising edge, and in (K+1)-th selection, a rising edge of one of the reference clocks which is delayed relative to the rising edge following the first rising edge of the normal pulse sequence by a duration that is LL(2×(K+1)) times the reference period is selected as the determined rising edge.

Furthermore, when causing selection circuit 12 to select, as the first determined rising edge, the rising edge of one of the reference clocks which is delayed relative to the first rising edge of the normal pulse sequence by the duration that is LL(2×K) times the reference period, control circuit 15 further causes, based on the third information stored in pulse width setting register (third resister) 133, selection circuit 12 to select, as the first determined falling edge corresponding to the first determined rising edge, a rising edge of one of the reference clocks which is delayed relative to the first rising edge by a duration that is P+LL(2×K+1) times the reference period.

Control circuit 15 includes PWM binary counter 151, period control circuit 152, PWM waveform generation circuit 153, and PWM phase adjustment circuit 154.

PWM binary counter 151 is a counter that increments a count value by 1 at a rising edge of the inputted microcomputer clock, and outputs the incremented count value at the next rising edge of the microcomputer clock.

Sequentially and repeatedly based on the first information stored in period setting register 131, period control circuit 152 initializes the count value of PWM binary counter 151 every time the count value reaches M−1. Here, the term "normalize the count value" means that the count value is set to an initial value of 0.

Sequentially and repeatedly based on the third information stored in pulse width setting register 133, PWM waveform generation circuit 153 sequentially and repeatedly generates a normal pulse (i) whose rising edge occurs at a time when the initialized value is outputted from PWM binary counter 151, and (ii) whose falling edge occurs at a time when the count value equal to P is outputted from PWM binary counter 151.

Based on the second information stored in high-resolution period setting register 132, PWM phase adjustment circuit 154 causes selection circuit 12 to sequentially and repeatedly select the determined rising edge so that in K-th selection, where K is an integer greater than or equal to 0, a rising edge of one of the reference clocks which is delayed relative to the first rising edge of the normal pulse sequence by a duration that is LL(2×K) times the reference period is selected as the determined rising edge, and in (K+1)-th selection, a rising edge of one of the reference clocks which is delayed relative to the rising edge following the first rising edge of the normal pulse sequence by a duration that is LL(2×(K+1)) times the reference period is selected as the determined rising edge.

Furthermore, when causing selection circuit 12 to select, as the first determined rising edge, the rising edge of one of the reference clocks which is delayed relative to the first rising edge of the normal pulse sequence by the duration that is LL(2×K) times the reference period, PWM phase adjustment circuit 154 further causes, sequentially and repeatedly based on the third information stored in pulse width setting register 133, selection circuit 12 to select, as the first determined falling edge corresponding to the first determined rising edge, a rising edge of one of the reference clocks which is delayed relative to the first rising edge by a duration that is P+LL(2×K+1) times the reference period.

Hereinafter, the operation performed by PWM phase adjustment circuit 154 in association with other circuits will be described with reference to drawings and a specific example.

Figure 3:
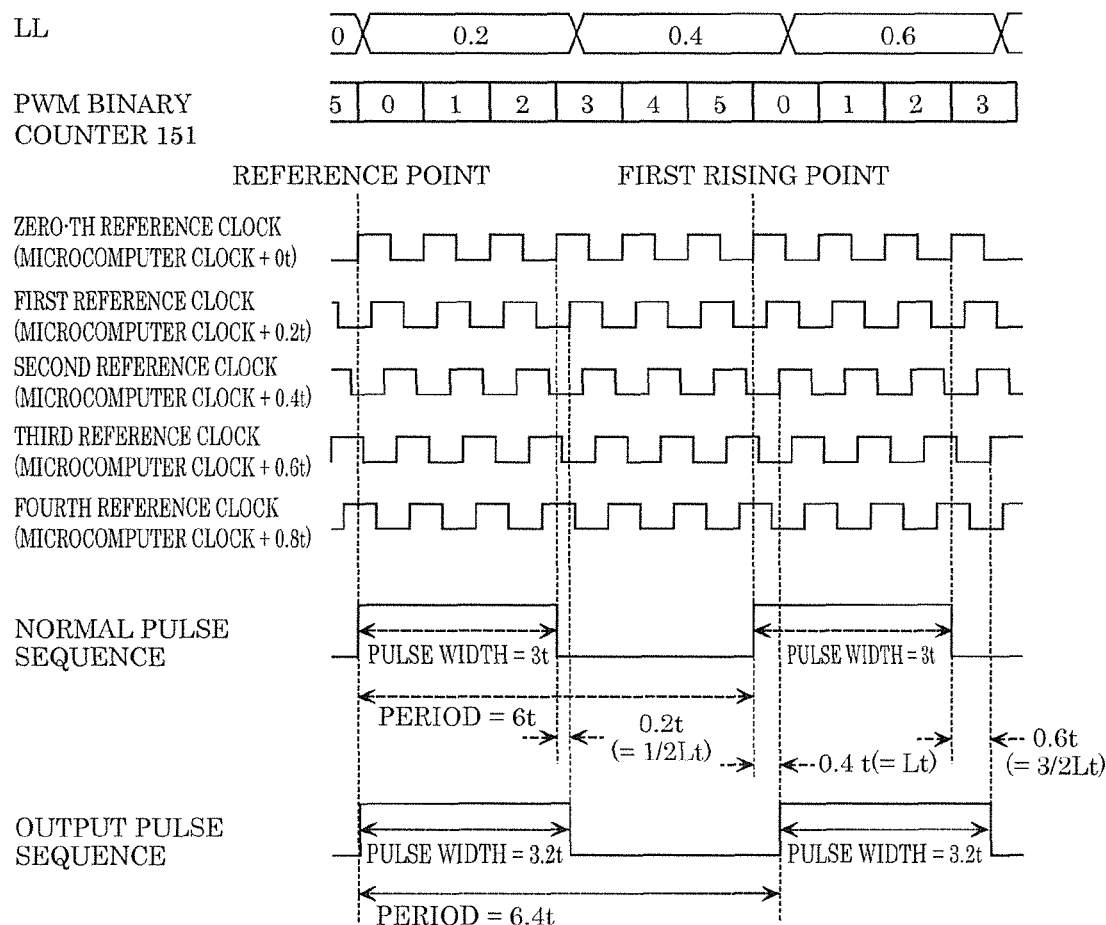
FIG. 3 illustrates the first timing chart of one specific example of the operation performed by a PWM phase adjustment circuit according to the embodiment in association with other circuits.
Figure 4:
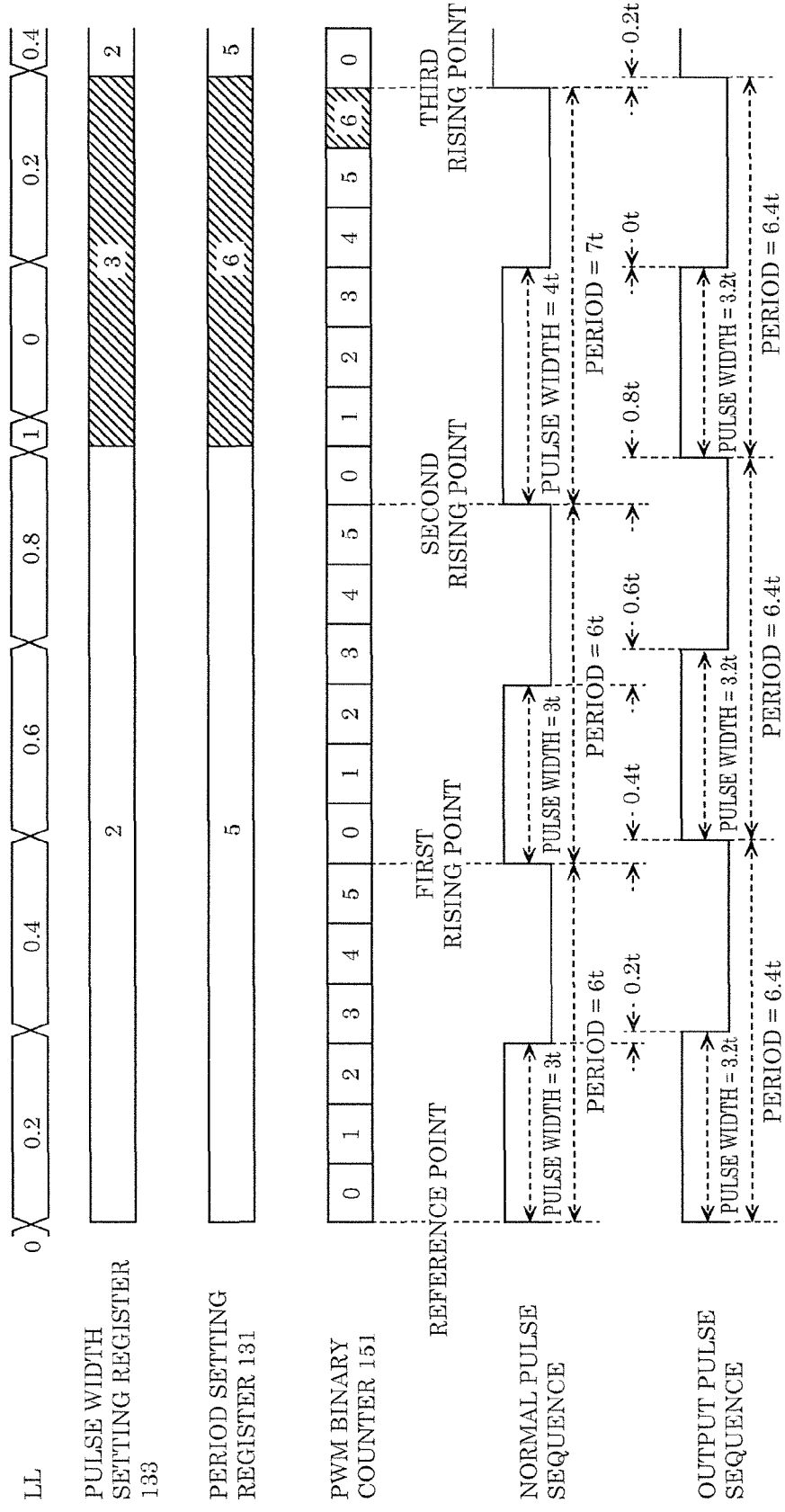
FIG. 4 illustrates the second timing chart of one specific example of the operation performed by the PWM phase adjustment circuit according to the embodiment in association with other circuits.

FIGS. 3 and 4 illustrate a timing chart of one specific example of the operation performed by PWM phase adjustment circuit 154 in association with other circuits.

FIGS. 3 and 4 illustrate a specific example where N is 5, M is 6, the first information for identifying M is 5 for M−1, L/2 and the second information for identifying L are 0.2, the third information for identifying P is 2 for P−1, and the period of the microcomputer clock is t.

In FIGS. 3 and 4, the "reference point" refers to a time point when 0 is outputted by the PWM binary counter while cumulative sum LL calculated by cumulative adder circuit 14 is 0.

FIG. 3 illustrates a timing chart including a duration that is 10 times the period of the microcomputer clock from the reference point. FIG. 4 illustrates a timing chart including a duration that is 20 times the period of the microcomputer clock from the reference point.

As shown in FIG. 3, reference clock generation circuit 11 provides 5 reference clocks, i.e. N reference clocks, whose phases differ by 0.2t, i.e. (1/N)×t, from one another and which have the same period as the microcomputer clock. In other words, reference clock generation circuit 11 provides: the zero-th reference clock whose phase is the same as that of the microcomputer clock; the first reference clock whose phase is delayed by 0.2t relative to the microcomputer clock; the second reference clock whose phase is delayed by 0.4t relative to the microcomputer clock; the third reference clock whose phase is delayed by 0.6t relative to the microcomputer clock; and the fourth reference clock whose phase is delayed by 0.8t relative to the microcomputer clock.

At the reference point, PWM waveform generation circuit 153 starts to provide a normal pulse whose rising edge occurs at a time when 0 is outputted from PWM binary counter 151.

After this, PWM phase adjustment circuit 154 causes selection circuit 12 to select, as the zero-th determined rising edge, a rising edge of the zero-th reference clock which is delayed by 0t, i.e. 0×t where 0 is cumulative sum LL, relative to the rising edge of the normal pulse, i.e. coincides with the rising edge of the normal pulse. Then, selection circuit 12 starts to generate an output pulse so that the rising edge of the output pulse coincides with the reference point. After this, cumulative adder circuit 14 adds 0.2, i.e. L/2, to cumulative sum LL of 0, and cumulative sum LL is set to 0.2.

Next, PWM waveform generation circuit 153 generates the normal pulse so that the falling edge of the normal pulse occurs at a time when 3, i.e. P, is outputted from PWM binary counter 151. Thus, the pulse width of the normal pulse generated by PWM waveform generation circuit 153 is 3t, i.e. P×t.

On the other hand, PWM phase adjustment circuit 154 causes selection circuit 12 to select, as the zero-th determined falling edge, a rising edge of the first reference clock which is delayed by 3.2t, i.e. (3+0.2)×t where 3 is P and 0.2 is cumulative sum LL, relative to the reference point. Then, selection circuit 12 generates the output pulse so that the falling edge of the output pulse is delayed by 3.2t relative to the reference point. Thus, the pulse width of the output pulse generated by selection circuit 12 is 3.2t, i.e. (P+L/2)×t.

After this, cumulative adder circuit 14 adds 0.2, i.e. L/2, to cumulative sum LL, and cumulative sum LL is set to 0.4.

Next, PWM waveform generation circuit 153 starts to provide a new normal pulse whose rising edge occurs at a time when 0 is outputted from PWM binary counter 151 (the first rising point shown in FIG. 3). Thus, the period of the last normal pulse outputted by PWM waveform generation circuit 153 is 6t, i.e. M×t.

Next, PWM phase adjustment circuit 154 causes selection circuit 12 to select, as the first determined rising edge, a rising edge of the second reference clock which is delayed by 0.4t, i.e. 0.4×t where 0.4 is cumulative sum LL, relative to the first rising point. Then, selection circuit 12 starts to generate a new output pulse so that the rising edge of the new output pulse is delayed by 0.4t relative to the first rising point. Thus, the period of the output pulse generated by selection circuit 12 is 6.4t.

After this, cumulative adder circuit 14 adds 0.2, i.e. L/2, to cumulative sum LL, and cumulative sum LL is set to 0.6.

Next, PWM waveform generation circuit 153 generates the new normal pulse so that the falling edge of the new normal pulse occurs at a time when 3, i.e. P, is outputted from PWM binary counter 151. Thus, the pulse width of the new normal pulse generated by PWM waveform generation circuit 153 is 3t, i.e. P×t.

Next, PWM phase adjustment circuit 154 causes selection circuit 12 to select, as the first determined falling edge, a rising edge of the third reference clock which is delayed by 3.6t, i.e. (3+0.6)×t where 3 is P and 0.6 is cumulative sum LL, relative to the first rising point. Then, selection circuit 12 generates the new output pulse so that the falling edge of the new output pulse is delayed by 3.6t relative to the first rising point. Thus, the pulse width of the new output pulse generated by selection circuit 12 is 3.2t.

After this, cumulative adder circuit 14 adds 0.2, i.e. L/2, to cumulative sum LL, and cumulative sum LL is set to 0.8.

The subsequent operation will be described with reference to FIG. 4.

After cumulative sum LL is set to 0.8 by cumulative adder circuit 14, PWM waveform generation circuit 153 starts to provide a new normal pulse whose rising edge occurs at a time when 0 is outputted from PWM binary counter 151 (the second rising point shown in FIG. 4). Thus, the period of the last normal pulse outputted by PWM waveform generation circuit 153 is 6t, i.e. M×t.

Next, PWM phase adjustment circuit 154 causes selection circuit 12 to select, as the second determined rising edge, a rising edge of the fourth reference clock (not shown in FIG. 4) which is delayed by 0.8t, i.e. 0.8×t where 0.8 is cumulative sum LL, relative to the second rising point. Then, selection circuit 12 starts to generate an output pulse so that the rising edge of the output pulse is delayed by 0.8t relative to the second rising point. Thus, the period of the output pulse generated by selection circuit 12 is 6.4t.

After this, cumulative adder circuit 14 adds 0.2, i.e. L/2, to cumulative sum LL, and cumulative sum LL is set to 1.

Cumulative sum LL is now greater than or equal to 1. Accordingly, cumulative adder circuit 14: subtracts 1 from cumulative sum LL to set new cumulative sum LL of 0; updates the value stored in period setting register 131 from 5, i.e. M−1, to 6, i.e. M−1+1; and also updates the value stored in pulse width setting register 133 from 2, i.e. P−1, to 3, i.e. P−1+1.

Next, PWM waveform generation circuit 153 generates the new normal pulse so that the falling edge of the new normal pulse occurs at a time when 4, i.e. P+1, is outputted from PWM binary counter 151. Thus, the pulse width of the new normal pulse generated by PWM waveform generation circuit 153 is 4t, i.e. (P+1)t.

On the other hand, PWM phase adjustment circuit 154 causes selection circuit 12 to select, as the second determined falling edge, a rising edge of the zero-th reference clock which is delayed by 4t, i.e. (P+1+0)×t where P is 3 and 0 is cumulative sum LL, relative to the second rising point. Then, selection circuit 12 generates the output pulse so that the falling edge of the output pulse is delayed by 4t relative to the second rising point. Thus, the pulse width of the output pulse generated by selection circuit 12 is 3.2t.

After this, cumulative adder circuit 14 adds 0.2, i.e. L/2, to cumulative sum LL, and cumulative sum LL is set to 0.2.

M is now 6, and thus PWM binary counter 151 continues to count up to 6. Accordingly, PWM binary counter 151 outputs the count value of 5, outputs the count value of 6, and then outputs the initial value of 0.

Next, PWM waveform generation circuit 153 starts to provide a normal pulse whose rising edge occurs at a time when 0 is outputted from PWM binary counter 151 (the third rising point shown in FIG. 4). Thus, the period of the last normal pulse outputted by PWM waveform generation circuit 153 is 7t.

Next, PWM phase adjustment circuit 154 causes selection circuit 12 to select, as the third determined rising edge, a rising edge of the first reference clock (not shown in FIG. 4) which is delayed by 0.2t, i.e. 0.2×t where 0.2 is cumulative sum LL, relative to the third rising point. Then, selection circuit 12 starts to generate an output pulse so that the rising edge of the output pulse is delayed by 0.2t relative to the third rising point. Thus, the period of the output pulse generated by selection circuit 12 is 6.4t.

After this, cumulative adder circuit 14 updates the value stored in period setting register 131 from 6, i.e. M−1+1, to 5, i.e. M−1, and also updates the value stored in pulse width setting register 133 from 3, i.e. P−1+1, to 2, i.e. P−1.

After this, PWM phase adjustment circuit 154 repeats the same operation, and thereby controls selection circuit 12 in association with other circuits to continue to provide from selection circuit 12 the output pulse sequence having a pulse width of 3.2t, i.e. (P+L/2)×t, and a period of 6.4t, i.e. (M+L)×t.

As described above with reference to the specific example, assuming that when the period of the microcomputer clock used as a clock signal by microcomputer 2 is t, period setting register 131 is set to M−1 by setter 22, where M is an integer greater than or equal to 1, high-resolution period setting register 132 is set to L by setter 22, where L is a decimal fraction greater than or equal to 0 and less than 1, and pulse width setting register 133 is set to P−1 by setter 22, where P is an integer greater than or equal to 1 and less than M, pulse-frequency control circuit 1 having the above configuration continues to provide the output pulse sequence having a pulse width of (P+L/2)×t and a period of (M+L)×t. L is now a decimal fraction, and thus this output pulse sequence can have a period that is in increments of a duration shorter than the period of the microcomputer clock.

[2. Operation]

Pulse-frequency control circuit 1 having the above configuration performs a high-resolution pulse-sequence output process as its distinctive operation.

This high-resolution pulse-sequence output process provides an output pulse sequence having a period that is in increments of a duration shorter than the period of the inputted microcomputer clock.

Hereinafter, this high-resolution pulse-sequence output process will be described with reference to the drawings.

Figure 5:
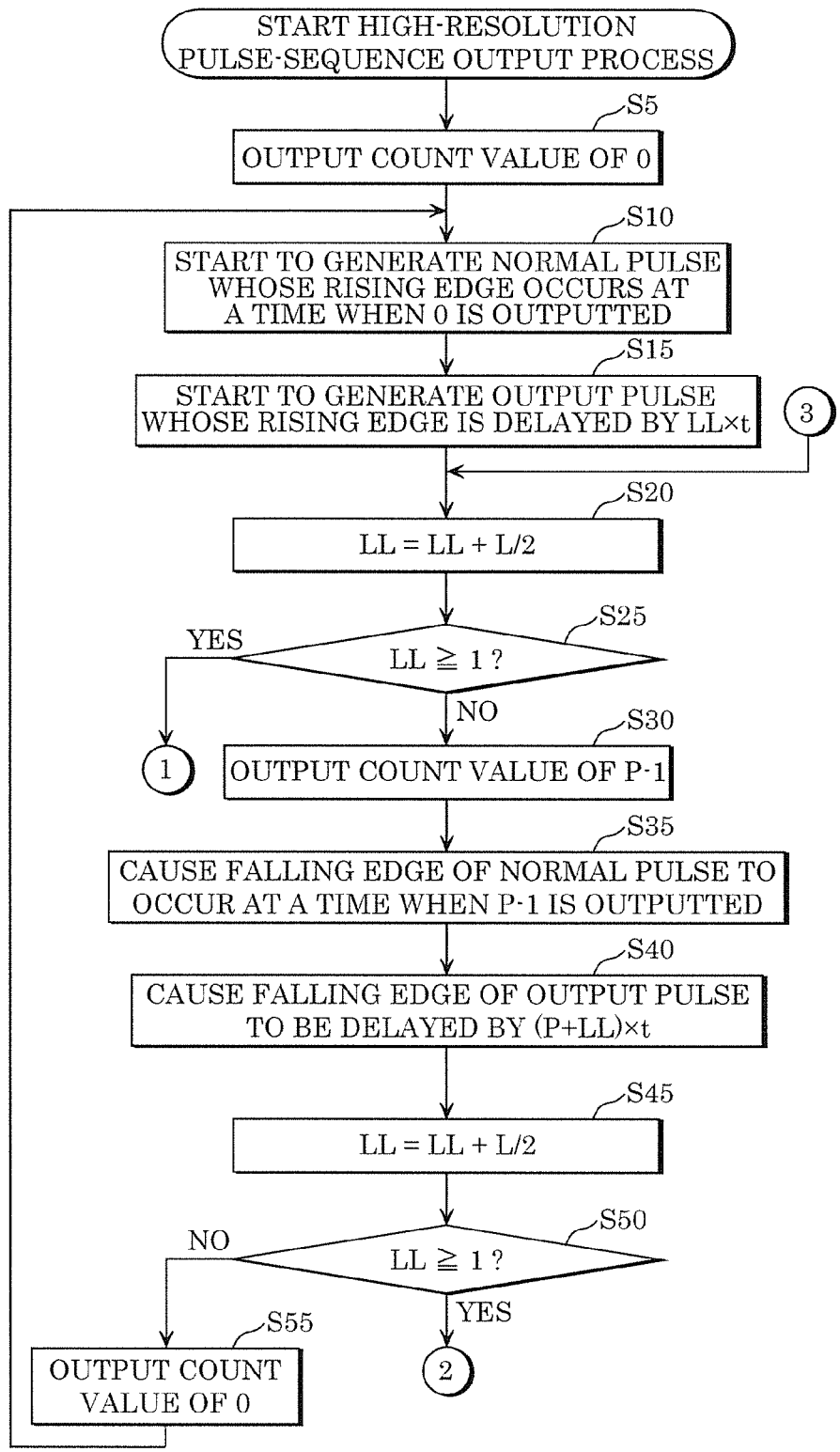
FIG. 5 illustrates the first flow chart of a high-resolution pulse-sequence output process according to the embodiment.
Figure 6:
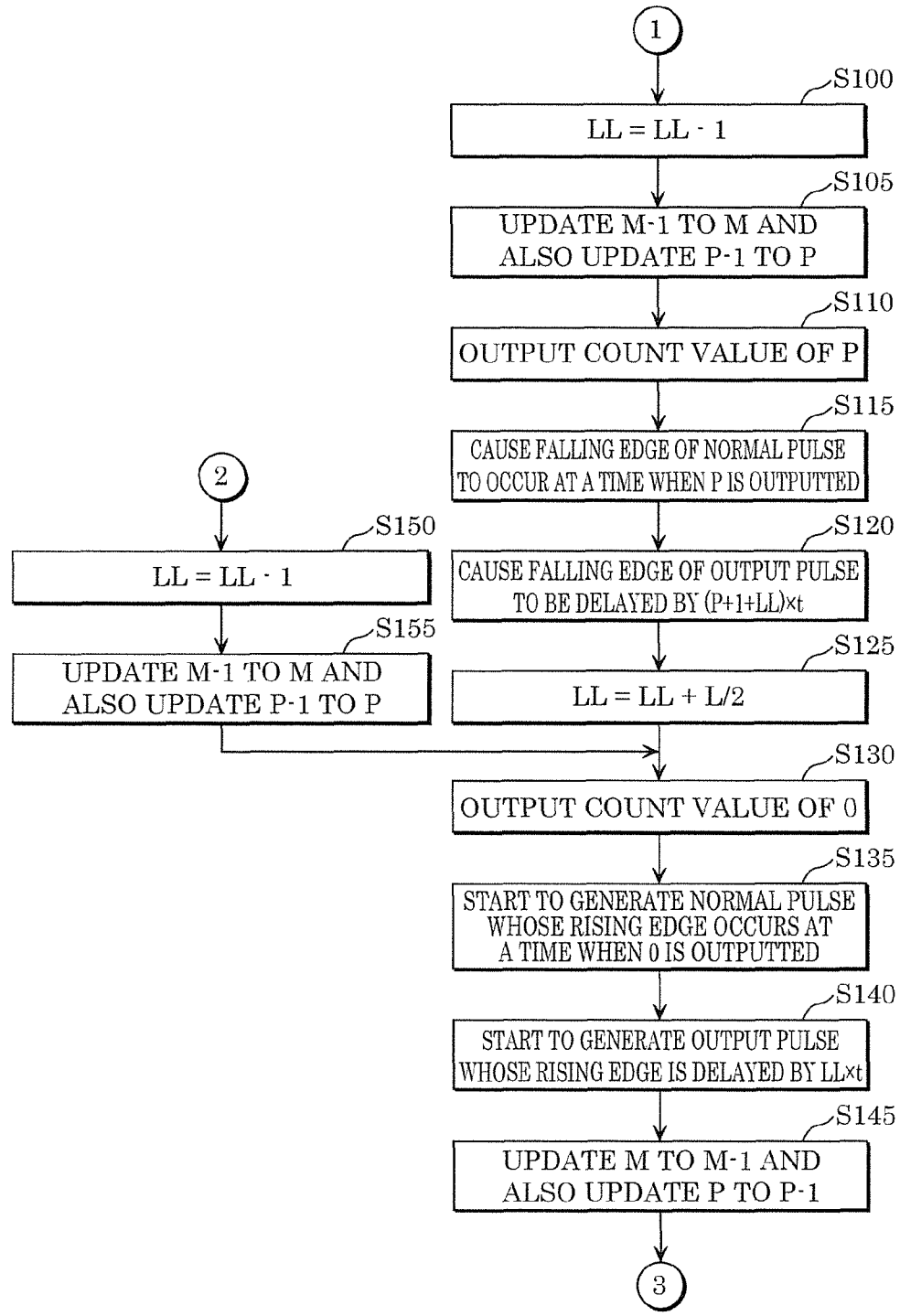
FIG. 6 illustrates the second flow chart of the high-resolution pulse-sequence output process according to the embodiment.

FIGS. 5 and 6 illustrate the flow chart of the high-resolution pulse-sequence output process.

The high-resolution pulse-sequence output process starts by receiving the microcomputer clock in pulse-frequency control circuit 1 after PWM binary counter 151 is initialized to 0, cumulative sum LL is also initialized to 0, and period setting register 131, high-resolution period setting register 132, and pulse width setting register 133 are set by setter 22.

Here, for illustrative purpose, it is assumed that: the period of the microcomputer clock is t; the number of reference clocks is N, where N is an integer greater than 2; and at a time when the high-resolution pulse-sequence output process starts, the value stored in period setting register 131 is M−1, where M is an integer greater than or equal to 1, the value stored in high-resolution period setting register 132 is L, where L is a decimal fraction greater than or equal to 0 and less than 1, and the value stored in pulse width setting register 133 is P−1, where P is an integer greater than or equal to 1 and less than M.

After the high-resolution pulse-sequence output process starts, reference clock generation circuit 11 starts to generate N reference clocks whose phases differ by 1/N from one another and which have the same period of t, and PWM binary counter 151 starts to count the number of the rising edges of the microcomputer clock. After this, as long as the microcomputer clock is inputted, reference clock generation circuit 11 continues to generate the N reference clocks, and PWM binary counter 151 continues to count the number of the rising edges of the microcomputer clock although being sometimes initialized.

When the count value becomes equal to M−1 after starting to count, the count value is initialized and PWM binary counter 151 outputs an initial value of 0 (step S5).

Then, PWM waveform generation circuit 153 starts to generate a normal pulse whose rising edge occurs at a time when the initial value of 0 is outputted (step S10).

At a time when LL×t has passed from the rising edge of the normal pulse, PWM phase adjustment circuit 154 causes selection circuit 12 to select, as the determined rising edge, a riding edge of one of the reference clocks which is delayed by LL×t relative to the rising edge of the normal pulse. Then, selection circuit 12 starts to generate an output pulse whose rising edge is delayed by LL×t relative to the rising edge of the normal pulse (step S15). After this, cumulative adder circuit 14 adds L/2 to cumulative sum LL (step S20).

When L/2 is added, cumulative adder circuit 14 determines whether or not cumulative sum LL is greater than or equal to 1 (step S25).

When cumulative sum LL is not greater than or equal to 1 at step S25 (step S25: No), PWM binary counter 151 outputs the count value of P−1 (step S30), and PWM waveform generation circuit 153 causes the falling edge of the generated normal pulse to occur at a time when the count value of P−1 is outputted from PWM binary counter 151 (step S35).

On the other hand, at a time when (P+LL)×t has passed from the rising edge of the normal pulse, PWM phase adjustment circuit 154 causes selection circuit 12 to select, as the determined falling edge, a riding edge of one of the reference clocks which is delayed by (P+LL)×t relative to the rising edge of the normal pulse. Then, selection circuit 12 causes the falling edge of the generated output pulse to be delayed by (P+LL)×t relative to the rising edge of the normal pulse (step S40). After this, cumulative adder circuit 14 adds L/2 to cumulative sum LL (step S45).

When L/2 is added, cumulative adder circuit 14 determines whether or not cumulative sum LL is greater than or equal to 1 (step S50).

When cumulative sum LL is not greater than or equal to 1 at step S50 (step S50: No), PWM binary counter 151 outputs the count value of 0 (step S55), and pulse-frequency control circuit 1 returns to step S10 and continues the subsequent steps.

When cumulative sum LL is greater than or equal to 1 at step S25 (step S25: Yes), cumulative adder circuit 14 calculates new cumulative sum LL by subtracting 1 from cumulative sum LL (step S100, see FIG. 6), updates the value stored in period setting register 131 from M−1 to M, and also updates the value stored in pulse width setting register 133 from P−1 to P (step S105).

After this, PWM binary counter 151 outputs the count value of P (step S110), and PWM waveform generation circuit 153 causes the falling edge of the generated normal pulse to occur at a time when the count value of P is outputted from PWM binary counter 151 (step S115).

On the other hand, at a time when (P+1+LL)×t has passed from the rising edge of the normal pulse, PWM phase adjustment circuit 154 causes selection circuit 12 to select, as the determined falling edge, a riding edge of one of the reference clocks which is delayed by (P+1+LL)×t relative to the rising edge of the normal pulse. Then, selection circuit 12 causes the falling edge of the generated output pulse to be delayed by (P+1+LL)×t relative to the rising edge of the normal pulse (step S120). After this, cumulative adder circuit 14 adds L/2 to cumulative sum LL (step S125).

After this, PWM binary counter 151 outputs the count value of 0 (step S130), and PWM waveform generation circuit 153 starts to generate a normal pulse whose rising edge occurs at a time when the initial value of 0 is outputted (step S135).

When LL×t has passed from the rising edge of the normal pulse, PWM phase adjustment circuit 154 causes selection circuit 12 to select, as the determined rising edge, a riding edge of one of the reference clocks which is delayed by LL×t relative to the rising edge of the normal pulse. Then, selection circuit 12 starts to generate an output pulse whose rising edge is delayed by LL×t relative to the rising edge of the normal pulse (step S140). After this, cumulative adder circuit 14 updates the value stored in period setting register 131 from M to M−1, and also updates the value stored in pulse width setting register 133 from P to P−1 (step S145).

After step S145, pulse-frequency control circuit 1 returns to step S20 (see FIG. 5) and continues the subsequent steps.

When cumulative sum LL is greater than or equal to 1 at step S50 (step S50: Yes), cumulative adder circuit 14 calculates new cumulative sum LL by subtracting 1 from cumulative sum LL (step S150, see FIG. 6), updates the value stored in period setting register 131 from M−1 to M, and also updates the value stored in pulse width setting register 133 from P−1 to P (step S155).

After step S155, pulse-frequency control circuit 1 proceeds to step S130 and continues the subsequent steps.

[3. Conclusion]

As described above, pulse-frequency control circuit 1 according to this embodiment can provide the output pulse sequence having the period that is in increments of the duration shorter than the period of the microcomputer clock. Thus, with this pulse-frequency control circuit 1, it is possible to achieve the switching frequency control of switching element 31 in higher resolution than the conventional pulse-frequency control circuit which provides an output pulse sequence having a period that is an integral multiple of the period of the microcomputer clock.

Therefore, DC-to-DC converter 3 according to this embodiment and including pulse-frequency control circuit 1 can more accurately control the output voltage than the conventional DC-to-DC converter including the conventional pulse-frequency control circuit.

Variation

In the foregoing embodiment, the operation performed by PWM phase adjustment circuit 154 in association with other circuits has been described with reference to FIGS. 3 and 4 and the specific example where M is 6 and P is 3, i.e. the duty cycle is 50%.

In contrast, here the operation performed by PWM phase adjustment circuit 154 in association with other circuits will be described with reference to drawings and another specific example where the duty cycle is not 50%.

Figure 7:
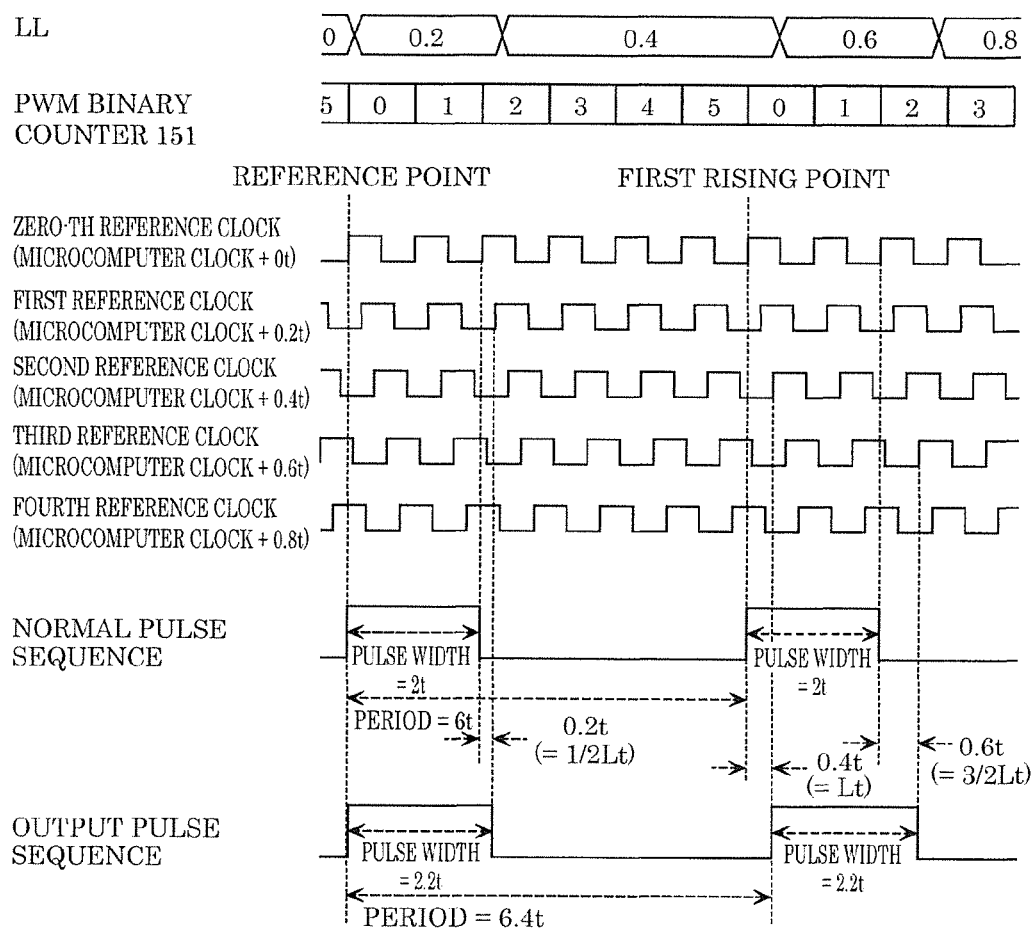
FIG. 7 illustrates the first timing chart of one specific example of the operation performed by a PWM phase adjustment circuit according to a variation in association with other circuits.
Figure 8:
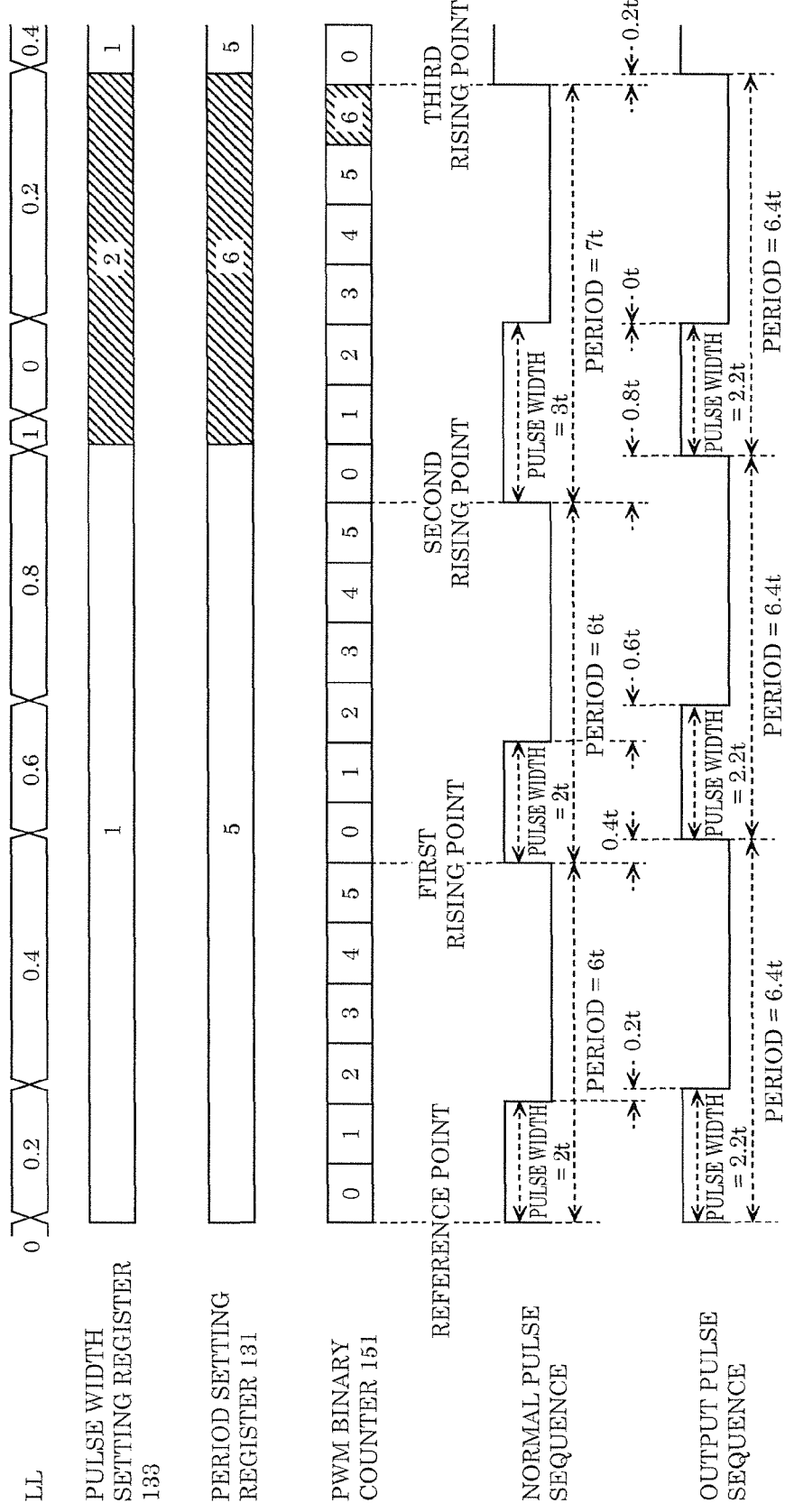
FIG. 8 illustrates the second timing chart of one specific example of the operation performed by the PWM phase adjustment circuit according to the variation in association with other circuits.

FIGS. 7 and 8 illustrate a timing chart of another specific example of the operation performed by PWM phase adjustment circuit 154 in association with other circuits.

FIGS. 7 and 8 illustrate a specific example where N is 5, M is 6, the first information for identifying M is 5 for M−1, L/2 and the second information for identifying L are 0.2, P is 2, the third information for identifying P is 1 for P−1, and the period of a microcomputer clock is t.

At the reference point, PWM waveform generation circuit 153 starts to provide a normal pulse whose rising edge occurs at a time when 0 is outputted from PWM binary counter 151.

After this, PWM phase adjustment circuit 154 causes selection circuit 12 to select, as the zero-th determined rising edge, a rising edge of the zero-th reference clock which is delayed by 0t, i.e. 0×t where 0 is cumulative sum LL, relative to the rising edge of the normal pulse, i.e. coincides with the rising edge of the normal pulse. Then, selection circuit 12 starts to generate an output pulse so that the rising edge of the output pulse coincides with the reference point. After this, cumulative adder circuit 14 adds 0.2, i.e. L/2, to cumulative sum LL of 0, and cumulative sum LL is set to 0.2.

Next, PWM waveform generation circuit 153 generates the normal pulse so that the falling edge of the normal pulse occurs at a time when 2, i.e. P, is outputted from PWM binary counter 151. Thus, the pulse width of the normal pulse generated by PWM waveform generation circuit 153 is 2t, i.e. P×t.

On the other hand, PWM phase adjustment circuit 154 causes selection circuit 12 to select, as the zero-th determined falling edge, a rising edge of the first reference clock which is delayed by 2.2t, i.e. (2+0.2)×t where 2 is P and 0.2 is cumulative sum LL, relative to the reference point. Then, selection circuit 12 generates the output pulse so that the falling edge of the output pulse is delayed by 2.2t relative to the reference point. Thus, the pulse width of the output pulse generated by selection circuit 12 is 2.2t, i.e. (P+L/2)×t.

After this, cumulative adder circuit 14 adds 0.2, i.e. L/2, to cumulative sum LL, and cumulative sum LL is set to 0.4.

Next, PWM waveform generation circuit 153 starts to provide a new normal pulse whose rising edge occurs at a time when 0 is outputted from PWM binary counter 151 (the first rising point shown in FIG. 7). Thus, the period of the last normal pulse outputted by PWM waveform generation circuit 153 is 6t, i.e. M×t.

Next, PWM phase adjustment circuit 154 causes selection circuit 12 to select, as the first determined rising edge, a rising edge of the second reference clock which is delayed by 0.4t, i.e. 0.4×t where 0.4 is cumulative sum LL, relative to the first rising point. Then, selection circuit 12 starts to generate a new output pulse so that the rising edge of the new output pulse is delayed by 0.4t relative to the first rising point. Thus, the period of the output pulse generated by selection circuit 12 is 6.4t.

After this, cumulative adder circuit 14 adds 0.2, i.e. L/2, to cumulative sum LL, and cumulative sum LL is set to 0.6.

Next, PWM waveform generation circuit 153 generates the new normal pulse so that the falling edge of the new normal pulse occurs at a time when 2, i.e. P, is outputted from PWM binary counter 151. Thus, the pulse width of the new normal pulse generated by PWM waveform generation circuit 153 is 2t, i.e. P×t.

Next, PWM phase adjustment circuit 154 causes selection circuit 12 to select, as the first determined falling edge, a rising edge of the third reference clock which is delayed by 2.6t, i.e. (2+0.6)×t where 2 is P and 0.6 is cumulative sum LL, relative to the first rising point. Then, selection circuit 12 generates the new output pulse so that the falling edge of the new output pulse is delayed by 2.6t relative to the first rising point. Thus, the pulse width of the new output pulse generated by selection circuit 12 is 2.2t.

After this, cumulative adder circuit 14 adds 0.2, i.e. L/2, to cumulative sum LL, and cumulative sum LL is set to 0.8.

The subsequent operation will be described with reference to FIG. 8.

After cumulative sum LL is set to 0.8 by cumulative adder circuit 14, PWM waveform generation circuit 153 starts to provide a new normal pulse whose rising edge occurs at a time when 0 is outputted from PWM binary counter 151 (the second rising point shown in FIG. 8). Thus, the period of the last normal pulse outputted by PWM waveform generation circuit 153 is 6t, i.e. M×t.

Next, PWM phase adjustment circuit 154 causes selection circuit 12 to select, as the second determined rising edge, a rising edge of the fourth reference clock (not shown in FIG. 8) which is delayed by 0.8t, i.e. 0.8×t where 0.8 is cumulative sum LL, relative to the second rising point. Then, selection circuit 12 starts to generate an output pulse so that the rising edge of the output pulse is delayed by 0.8t relative to the second rising point. Thus, the period of the output pulse generated by selection circuit 12 is 6.4t.

After this, cumulative adder circuit 14 adds 0.2, i.e. L/2, to cumulative sum LL, and cumulative sum LL is set to 1.

Cumulative sum LL is now greater than or equal to 1. Accordingly, cumulative adder circuit 14: subtracts 1 from cumulative sum LL to set new cumulative sum LL of 0; updates the value stored in period setting register 131 from 5, i.e. M−1, to 6, i.e. M−1+1; and also updates the value stored in pulse width setting register 133 from 1, i.e. P−1, to 2, i.e. P−1+1.

Next, PWM waveform generation circuit 153 generates the new normal pulse so that the falling edge of the new normal pulse occurs at a time when 3, i.e. P+1, is outputted from PWM binary counter 151. Thus, the pulse width of the new normal pulse generated by PWM waveform generation circuit 153 is 3t, i.e. (P+1)t.

On the other hand, PWM phase adjustment circuit 154 causes selection circuit 12 to select, as the second determined falling edge, a rising edge of the zero-th reference clock which is delayed by 3t, i.e. (P+1+0)×t where P is 2 and 0 is cumulative sum LL, relative to the second rising point. Then, selection circuit 12 generates the output pulse so that the falling edge of the output pulse is delayed by 3t relative to the second rising point. Thus, the pulse width of the output pulse generated by selection circuit 12 is 2.2t.

After this, cumulative adder circuit 14 adds 0.2, i.e. L/2, to cumulative sum LL, and cumulative sum LL is set to 0.2.

M is now 6, and thus PWM binary counter 151 continues to count up to 6. Accordingly, PWM binary counter 151 outputs the count value of 5, outputs the count value of 6, and then outputs the initial value of 0.

Next, PWM waveform generation circuit 153 starts to provide a normal pulse whose rising edge occurs at a time when 0 is outputted from PWM binary counter 151 (the third rising point shown in FIG. 8). Thus, the period of the last normal pulse outputted by PWM waveform generation circuit 153 is 7t.

Next, PWM phase adjustment circuit 154 causes selection circuit 12 to select, as the third determined rising edge, a rising edge of the first reference clock (not shown in FIG. 8) which is delayed by 0.2t, i.e. 0.2×t where 0.2 is cumulative sum LL, relative to the third rising point. Then, selection circuit 12 starts to generate an output pulse so that the rising edge of the output pulse is delayed by 0.2t relative to the third rising point. Thus, the period of the output pulse generated by selection circuit 12 is 6.4t.

After this, cumulative adder circuit 14 updates the value stored in period setting register 131 from 6, i.e. M−1+1, to 5, i.e. M−1, and also updates the value stored in pulse width setting register 133 from 2, i.e. P−1+1, to 1, i.e. P−1.

After this, PWM phase adjustment circuit 154 repeats the same operation, and thereby controls selection circuit 12 in association with other circuits to continue to provide from selection circuit 12 the output pulse sequence having a pulse width of 2.2t, i.e. (P+L/2)×t, and a period of 6.4t, i.e. (M+L)×t.

As described above with reference to another specific example, pulse-frequency control circuit 1 having the above configuration can provide an output pulse sequence having a different duty cycle in accordance with a combination of M and P.

Other Variations

As described above, the foregoing embodiment and variation have been described as an example of technique disclosed in the present application. However, the technique according to the present disclosure is not limited to them, and can be applied to an embodiment appropriately modified, replaced, added, omitted, or the like.

(i) In the foregoing embodiment, DC-to-DC converter 3 having the configuration shown in FIG. 1 has been illustrated as one example of the DC-to-DC converter according to an aspect of the present disclosure.

However, the DC-to-DC converter according to an aspect of the present disclosure need not necessarily be limited to DC-to-DC converter 3 having the configuration shown in FIG. 1.

Hereinafter, some other exemplary configurations of the DC-to-DC converter according to an aspect of the present disclosure will be described.

Figure 9:
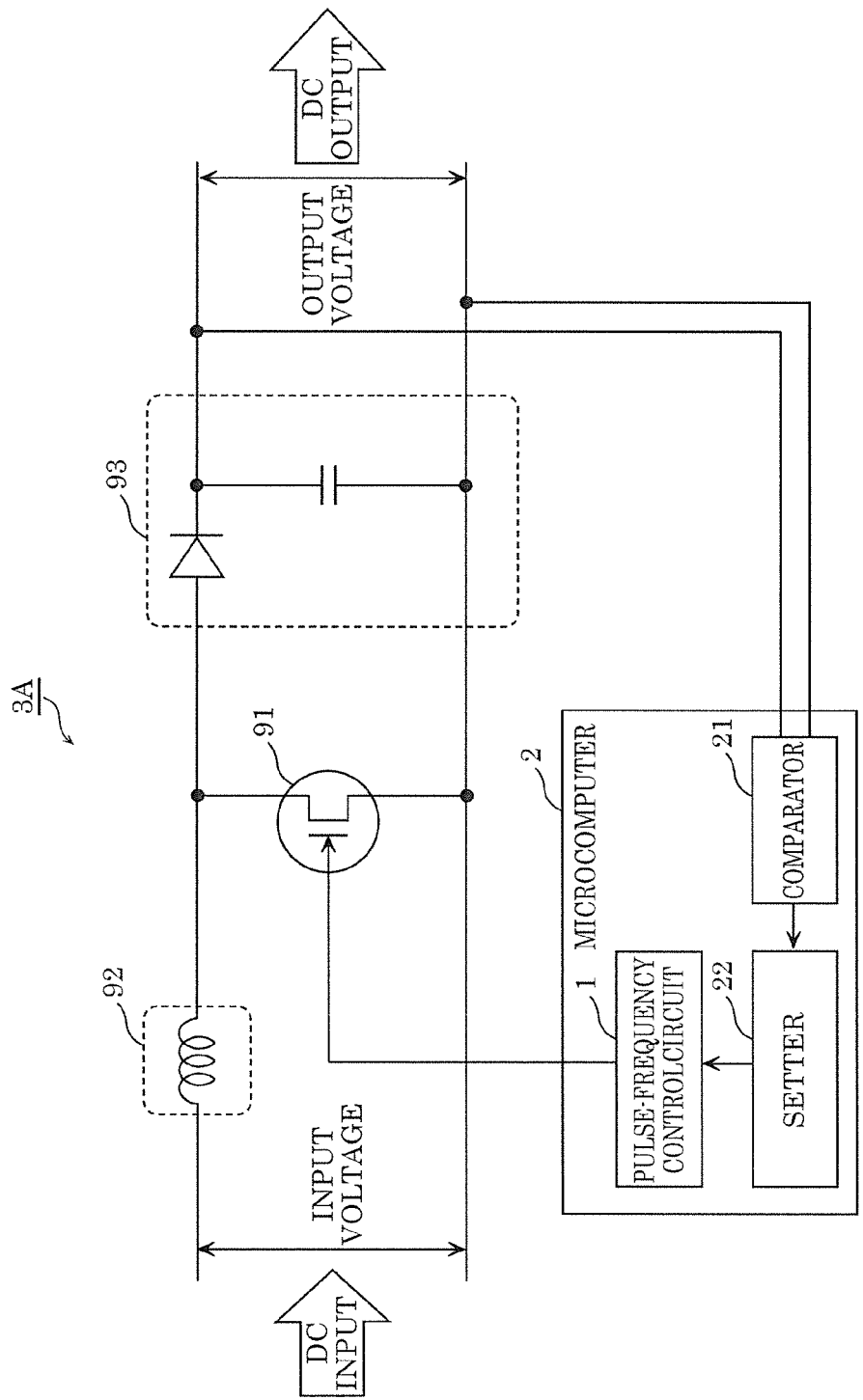
FIG. 9 illustrates a block diagram of the configuration of a DC-to-DC converter according to another variation.

FIG. 9 illustrates a block diagram of the configuration of DC-to-DC converter 3A which is one other example of the DC-to-DC converter according to an aspect of the present disclosure.

As shown in FIG. 9, DC-to-DC converter 3A includes switching element 91, energy conversion circuit 92, rectifying and smoothing circuit 93, and microcomputer 2.

DC-to-DC converter 3 according to the foregoing embodiment (see FIG. 1) is an implementation example in which energy conversion circuit 32 includes a transformer, whereas this DC-to-DC converter 3A is an implementation example in which energy conversion circuit 92 includes a coil instead of the transformer, i.e. a chopper type DC-to-DC converter.

Figure 10:
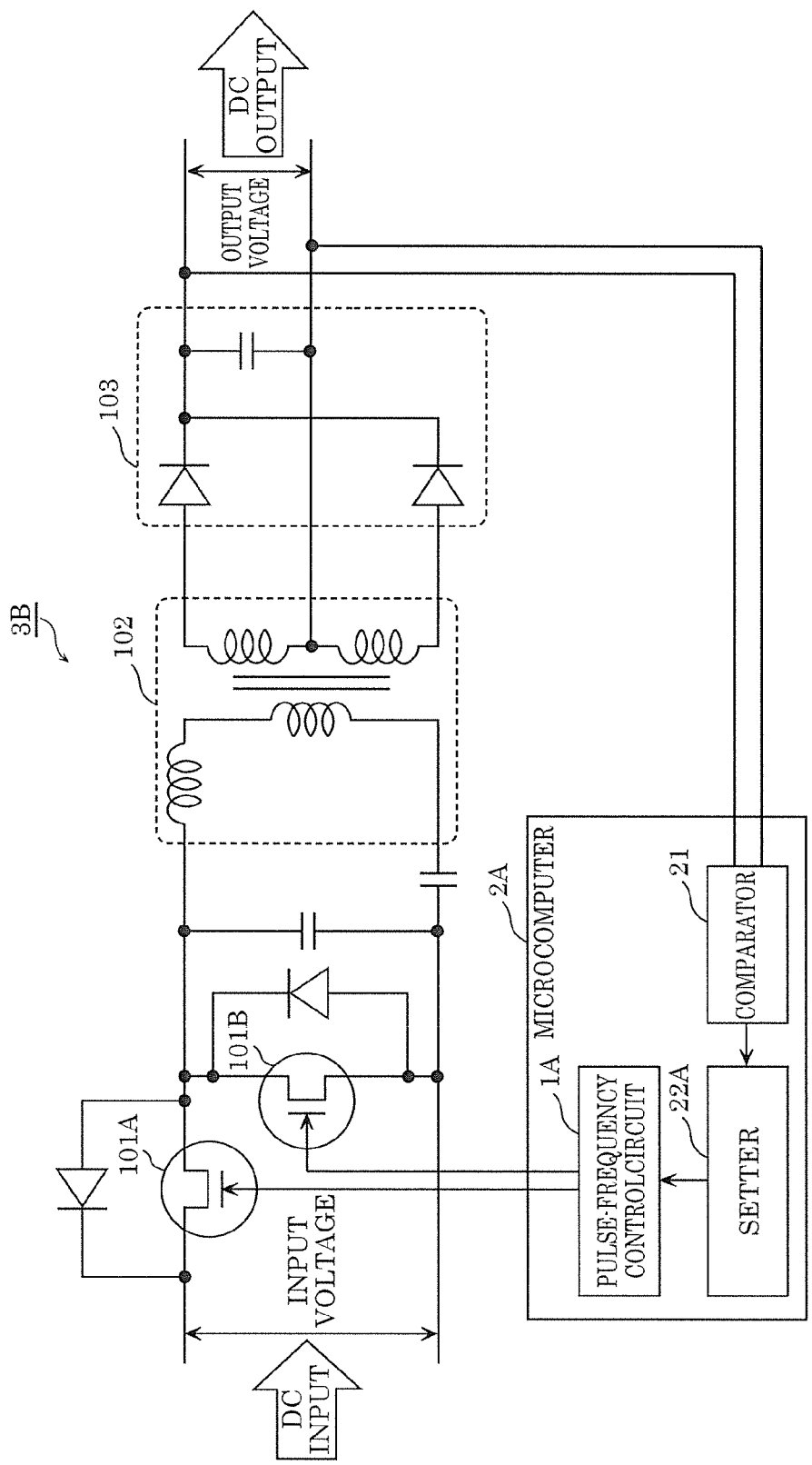
FIG. 10 illustrates a block diagram of the configuration of a DC-to-DC converter according to another variation.

FIG. 10 illustrates a block diagram of the configuration of DC-to-DC converter 3B which is another example of the DC-to-DC converter according to an aspect of the present disclosure.

As shown in FIG. 10, DC-to-DC converter 3B includes first switching element 101A, second switching element 101B, energy conversion circuit 102, rectifying and smoothing circuit 103, and microcomputer 2A.

DC-to-DC converter 3 according to the foregoing embodiment (see FIG. 1) is an implementation example including one switching element and pulse-frequency control circuit 1 which provides one output pulse sequence, whereas this DC-to-DC converter 3B is an implementation example including two switching elements which switch in different phases, and pulse-frequency control circuit 1A whose functionality is partially modified from pulse-frequency control circuit 1 according to the foregoing embodiment to provide two output pulse sequences whose phases differ from each other.

(ii) In the foregoing embodiment, pulse-frequency control circuit 1 has been described as being included in a microcomputer (microcomputer 2).

However, the pulse-frequency control circuit according to an aspect of the present disclosure need not necessarily be limited to the configuration included in a microcomputer.

As one example, pulse-frequency control circuit 1 may be implemented as a single semiconductor integrated circuit instead of being included in a microcomputer. Alternatively, pulse-frequency control circuit 1 may be included in an electronic component other than a microcomputer.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is broadly applicable to a circuit that provides a pulse.

What is claimed is:

1. A pulse-frequency control circuit, comprising:
a selection circuit that receives, and selects from among, a plurality of reference clocks whose phases differ from one another and which have a same reference period;
a setting register that stores information for identifying a setting period that is in increments of a first duration shorter than the reference period; and
a control circuit that causes, based on the information stored in the setting register, the selection circuit to sequentially and repeatedly select, as a determined rising edge, a rising edge occurring at intervals of the setting period from among rising edges of the plurality of reference clocks,
wherein the selection circuit sequentially and repeatedly generates an output pulse whose rising edge coincides with the determined rising edge selected, to provide an output pulse sequence of the output pulses.

2. The pulse-frequency control circuit according to claim 1, wherein
the control circuit sequentially and repeatedly generates a normal pulse having a period that is M times the reference period, to generate a normal pulse sequence of the normal pulses, M being an integer greater than or equal to 1, and
a value of M is changed to I under a predetermined condition, I being an integer greater than or equal to 1.

3. The pulse-frequency control circuit according to claim 1, wherein
the plurality of reference clocks comprise N reference clocks whose phases differ by 1/N of the reference period from one another, N being an integer greater than or equal to 2,
the first duration is 1/N of the reference period,
M is an integer part of a quotient obtained by dividing the setting period by the reference period,
the setting register comprises a first register that stores first information for identifying M, and a second register that stores second information for identifying a fractional part L of the quotient, L being a decimal fraction greater than or equal to 0 and less than 1,
the control circuit sequentially and repeatedly generates, based on the first information stored in the first register, a normal pulse having a period that is M times the reference period, to generate a normal pulse sequence of the normal pulses,
the pulse-frequency control circuit further includes a cumulative adder circuit that: cumulatively adds L/2 based on the second information stored in the second register every time a rising edge or a falling edge occurs in the output pulse sequence provided from the selection circuit; and calculates cumulative sum LL(J) when L/2 is added J times, where J is an integer greater than or equal to 0, and
the control circuit causes, based on the second information stored in the second register, the selection circuit to perform the selection by selecting, as the determined rising edge in K-th selection, a rising edge of one of the plurality of reference clocks which is delayed relative to a first rising edge of the normal pulse sequence by a duration that is LL(2×K) times the reference period, and as the determined rising edge in (K+1)-th selection, a rising edge of one of the plurality of reference clocks which is delayed relative to a rising edge following the first rising edge of the normal pulse sequence by a duration that is LL(2×(K+1)) times the reference period, K being an integer greater than or equal to 0.

4. The pulse-frequency control circuit according to claim 3, wherein
when LL(J) obtained by cumulatively adding L/2 is greater than or equal to 1, the cumulative adder circuit (i) calculates new LL(J) by subtracting 1 from the LL(J) obtained, (ii) updates the first information stored in the first register from information for identifying M to information for identifying M+1, and (iii) further updates the first information stored in the first register from the information for identifying M+1 to the information for identifying M at a time when a rising edge occurs first after the update (ii) in the output pulse sequence provided from the selection circuit.

5. The pulse-frequency control circuit according to claim 4, wherein
M is an integer greater than or equal to 2,
the setting register further comprises a third register that stores third information for identifying an integer P, P being an integer greater than or equal to 1 and less than M,
when causing the selection circuit to select, as a first determined rising edge, the rising edge of one of the plurality of reference clocks which is delayed relative to the first rising edge of the normal pulse sequence by the duration that is LL(2×K) times the reference period, the control circuit further causes, based on the third information stored in the third resister, the selection circuit to select, as a first determined falling edge corresponding to the first determined rising edge, a rising edge of one of the plurality of reference clocks which is delayed relative to the first rising edge by a duration that is P+LL(2×K+1) times the reference period, and the selection circuit generates the output pulse whose rising edge coincides with the first determined rising edge and whose falling edge coincides with the first determined falling edge.

6. The pulse-frequency control circuit according to claim 5, wherein when LL(J) obtained by cumulatively adding L/2 is greater than or equal to 1, the cumulative adder circuit (i) updates the third information stored in the third resister from information for identifying P to information for identifying P+1, and (ii) further updates the third information stored in the third register from the information for identifying P+1 to the information for identifying P at a time when a rising edge occurs first after the update (i) in the output pulse sequence provided from the selection circuit.

7. The pulse-frequency control circuit according to claim 1, further comprising:

a reference clock generation circuit that generates the plurality of reference clocks from an input reference clock having the reference period, the plurality of reference clocks being received by the selection circuit.

8. A microcomputer, comprising:

the pulse-frequency control circuit according to claim 1; and a setter that writes a value to the setting register.

9. A DC-to-DC converter, comprising:

the microcomputer according to claim 8;

a switching element that performs switching of an input voltage in accordance with the output pulse sequence provided from the selection circuit, the input voltage being a direct current input voltage;

an energy conversion circuit that, when receiving the input voltage the switching of which has been performed by the switching element, generates an electromotive force due to current fluctuation caused by voltage fluctuation of the input voltage and provides a voltage depending on the electromotive force; and a rectifying and smoothing circuit that rectifies and smoothes the voltage provided from the energy conversion circuit and provides an output voltage, the output voltage being a direct current output voltage, wherein the microcomputer further includes a comparator that compares a potential of the output voltage with a predetermined potential, and the setter performs the writing based on a comparison result by the comparator so that the potential of the output voltage is closer to the predetermined potential.

10. A pulse-frequency control method performed by a pulse-frequency control circuit including a selection circuit, a setting register, and a control circuit, the selection circuit receiving, and selecting from among, a plurality of reference clocks whose phases differ from one another and which have a same reference period, the pulse-frequency control method comprising:

storing, by the setting register, information for identifying a setting period that is in increments of a first duration shorter than the reference period;

causing, by the control circuit, based on the information stored by the storing, the selection circuit to sequentially and repeatedly select, as a determined rising edge, a rising edge occurring at intervals of the setting period from among rising edges of the plurality of reference clocks; and sequentially and repeatedly generating, by the selection circuit, an output pulse whose rising edge coincides with the determined rising edge selected, to provide an output pulse sequence of the output pulses.

* * * * *